(12) United States Patent
Smith et al.

(10) Patent No.: US 10,347,517 B2
(45) Date of Patent: Jul. 9, 2019

(54) TOWERS FOR SUBSTRATE CARRIERS

(71) Applicant: ENTEGRIS, INC., Billerica, MA (US)

(72) Inventors: Mark V. Smith, Colorado Springs, CO (US); Christopher Beatty, Colorado Springs, CO (US); Murali Bandreddi, Colorado Springs, CO (US)

(73) Assignee: Entegris, Inc., Billerica, MA (US)

( * ) Notice: Subject to any disclaimer, the term of this patent is extended or adjusted under 35 U.S.C. 154(b) by 505 days.

(21) Appl. No.: 15/029,605

(22) PCT Filed: Oct. 14, 2014

(86) PCT No.: PCT/US2014/060533
§ 371 (c)(1),
(2) Date: Apr. 14, 2016

(87) PCT Pub. No.: WO2015/057739
PCT Pub. Date: Apr. 23, 2015

(65) Prior Publication Data
US 2016/0276190 A1    Sep. 22, 2016

Related U.S. Application Data

(60) Provisional application No. 61/940,744, filed on Feb. 17, 2014, provisional application No. 61/890,611, filed on Oct. 14, 2013.

(51) Int. Cl.
*H01L 21/673* (2006.01)

(52) U.S. Cl.
CPC .............................. *H01L 21/67393* (2013.01)

(58) Field of Classification Search
CPC ............ B65D 81/2053; B65D 81/2061; B65D 81/2069; B65D 81/2076; B65D 81/2084
(Continued)

(56) References Cited

U.S. PATENT DOCUMENTS 6,221,163 B1 *  4/2001  Roberson, Jr. .... H01L 21/67017
                                                            118/715
2008/0298933 A1   12/2008  Hsiao et al.
(Continued)

FOREIGN PATENT DOCUMENTS

JP      2001-500669 A     1/2001
JP      2002-170876 A     6/2002
(Continued)

*Primary Examiner* — King M Chu
(74) *Attorney, Agent, or Firm* — Entegris, Inc.

(57) ABSTRACT

A diffuser tower assembly having a diffuser with a flared end and a fitting with an offset portion and nipple sized for the flared end. The assembly may be configured for providing low coverage purging. Diffuser tower assemblies may be in the form of a kit for retrofitting existing front opening wafer containers. The inlet fitting may include structure that enhances purge characteristics near the base of the porous media diffuser for enhanced sweeping of the floor of the substrate container. Embodiments of the disclosure generate an uneven flow distribution that provides a non-uniform flow distribution at the opening. In an embodiment, where the opening is in a substantially vertical orientation, the non-uniform flow distribution is tailored to deliver a greater flow rate to the bottom half of the opening than to the top of the opening.

8 Claims, 13 Drawing Sheets

(58) Field of Classification Search
USPC .................................................. 206/213.1
See application file for complete search history.

(56) References Cited

U.S. PATENT DOCUMENTS

2011/0114534 A1* 5/2011 Watson ............. H01L 21/67393
                                                                                                                  206/710
2012/0297981 A1* 11/2012 Burns ............... H01L 21/67376
                                                                                                                  95/273

FOREIGN PATENT DOCUMENTS

| JP | 2002-175999 A | 6/2002 |
| JP | 2004-146676 A | 5/2004 |
| JP | 2007-019500 A | 1/2007 |
| JP | 2007-511098 A | 4/2007 |
| JP | 2008-066635 A | 3/2008 |
| JP | 2010-270823 A | 12/2010 |
| JP | 2011-514014 A | 4/2011 |
| JP | 2013-513951 A | 4/2013 |
| JP | 2013-179287 A | 9/2013 |
| WO | 2006/083290 A2 | 8/2006 |

* cited by examiner

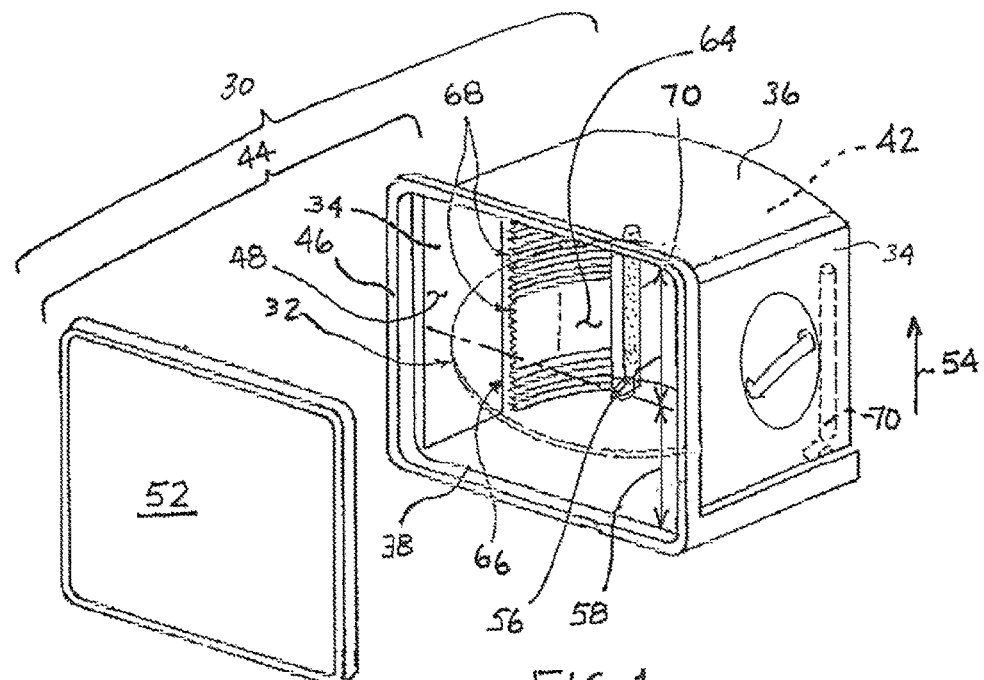
FIG. 1
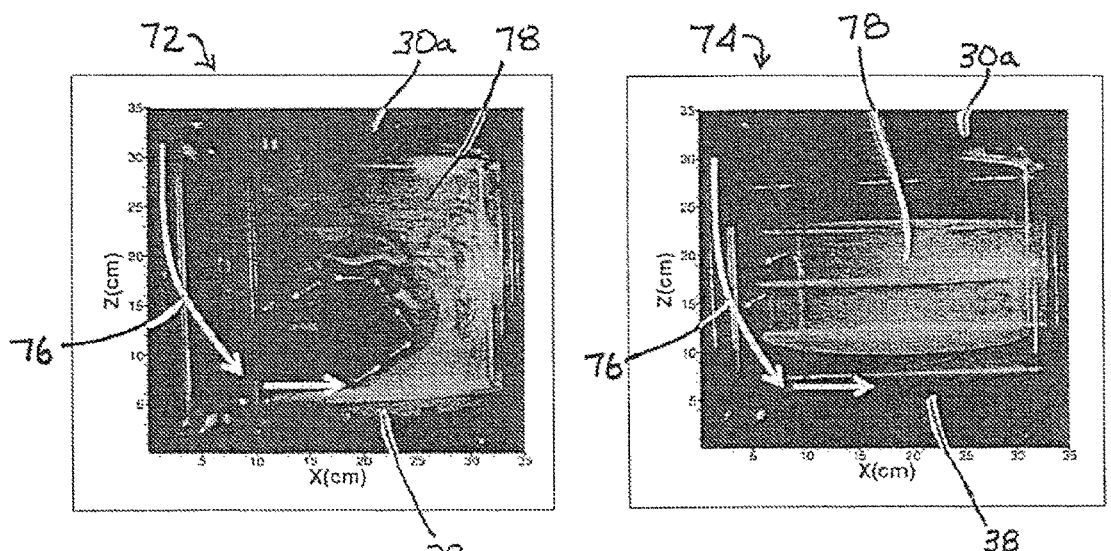
FIG. 2A
FIG. 2B

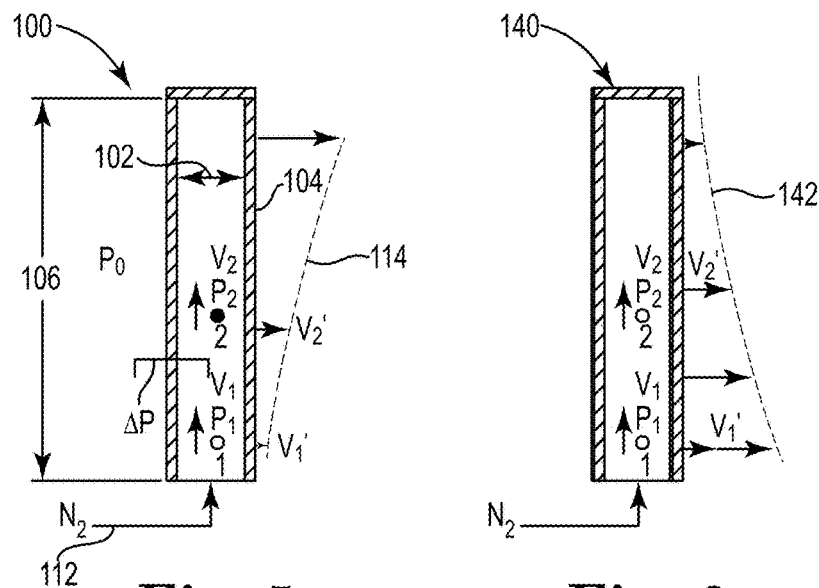
Fig. 5
(PRIOR ART)
Fig. 6
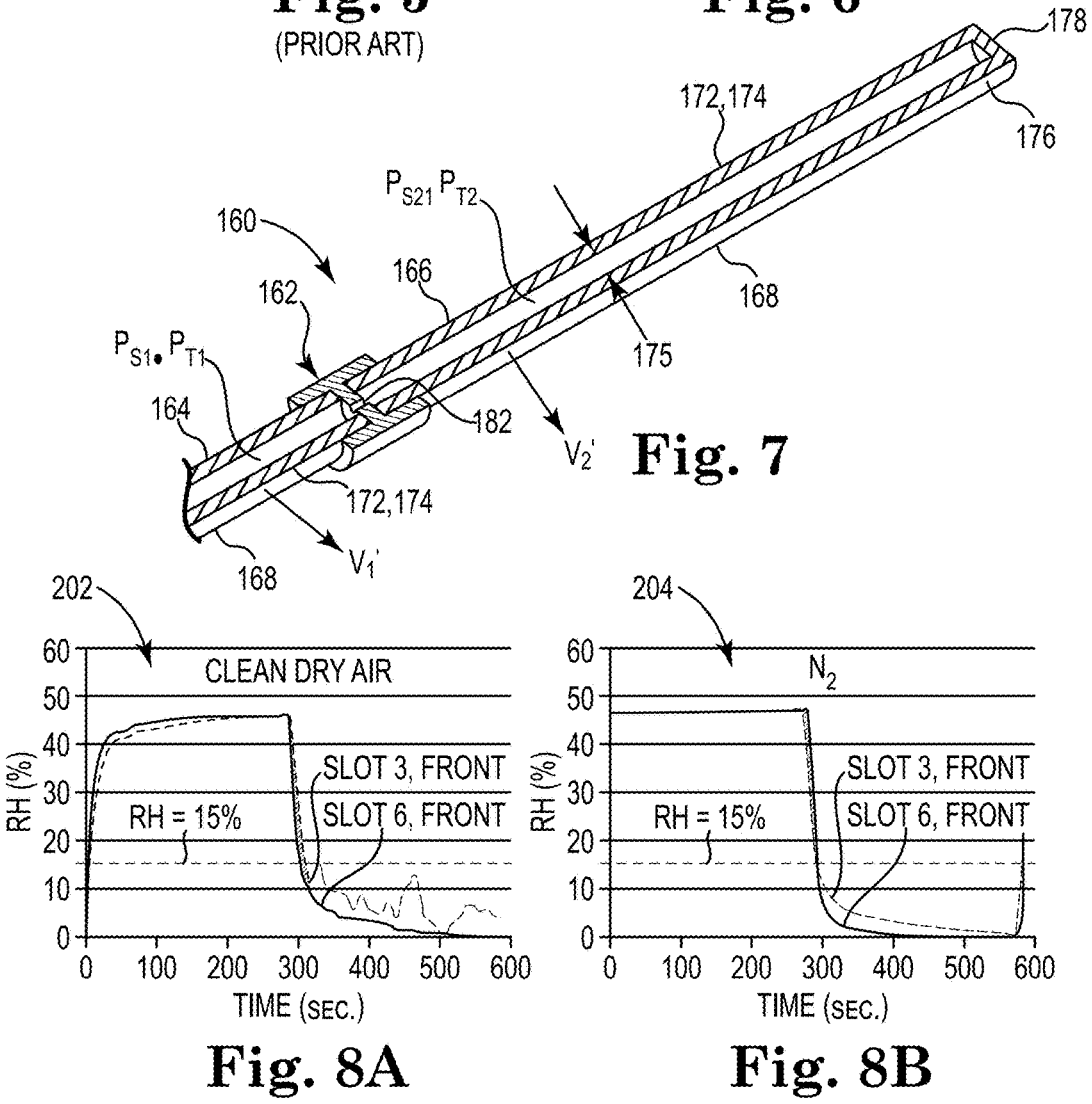
Fig. 7
Fig. 8A
Fig. 8B

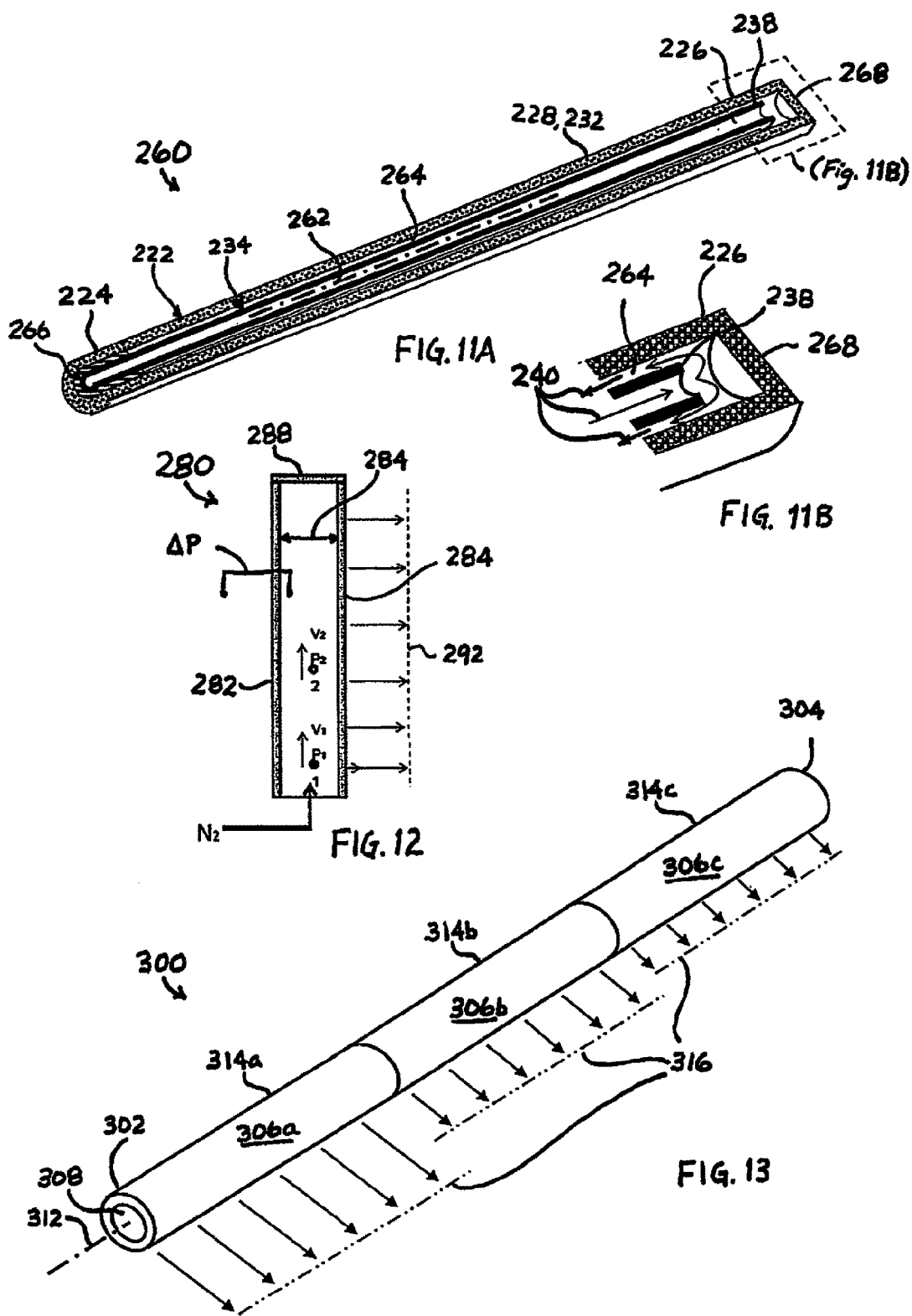

TOWERS FOR SUBSTRATE CARRIERS

RELATED APPLICATIONS

This present application is a National Phase entry of PCT Application No. PCT/US2014/060533, filed Oct. 14, 2014, which claims the benefit of U.S. Provisional Patent Application No. 61/890,611, filed Oct. 14, 201 and U.S. Provisional Patent Application No. 61/940,744, filed Feb. 17, 2014, the disclosures of which are incorporated by reference herein in their entireties.

TECHNICAL FIELD OF THE DISCLOSURE

The present disclosure relates to transportable substrate containers suitable for use in storing or transporting objects such as semiconductor wafers in a clean environment and more particularly to systems and methods for purging the environment within said container during exposure of the container to the ambient environment.

BACKGROUND OF THE DISCLOSURE

During insertion or removal of substrates from a substrate container, such as front opening wafer containers, traces of dust, gaseous impurities, or increased humidity can be introduced into the substrate container, adversely affecting product yield of the resident wafers. Accordingly, there is an increased demand for controlling the environment within these transport containers during substrate handling to achieve or maintain a high level of cleanliness.

A microenvironment within a substrate container is typically purged using an inert gas that is injected into the interior of the container through an inlet port causing the air within the container to exit through an outlet port. Systems and methods of delivering purge gas into the container have been designed to provide the improved environment within the container. See, e.g., U.S. Pat. No. 6,221,163 to Roberson et al. ("Roberson"), disclosing a system and method for molecular contamination control permitting purging a container to desired levels of relative humidity, oxygen, or particulates. See also, e.g., U.S. Patent Application Publication No. 2012/0297981 to Burns et al. ("Burns"), disclosing a purge gas inlet port that is be fitted with a tower for vertical distribution the flow of the gas to provide an even distribution of the purging gas within the microenvironment.

The aforementioned references are designed for control of an enclosed microenvironment. That is, conventional equipment and methods that address microenvironment control of substrate containers assume that an opening through which substrates are loaded and unloaded is sealed off by an access door. These systems do not address the intrusion of ambient air into the substrate container during insertion or removal of substrates, i.e., when the access door is removed and the opening is exposed. Such intrusion of ambient air can adversely affect the yield of the resident substrates, even when the ambient environment is that of a clean room.

Additionally, these references do not address the connections between a diffuser tube and an upwardly facing fitting of a purge port assembly. Such connections need to be robust and the port assembly needs to be low profile so as to not interfere with the wafer slots. An improved purging apparatus and method that addresses the issue of ambient environment encroachment when the substrate container is opened to the ambient environment would be welcomed.

SUMMARY OF THE DISCLOSED EMBODIMENTS

Various embodiments of the disclosure generate an uneven flow distribution that provides a non-uniform flow distribution at the opening. The flow distribution at the opening is tailored to counter the inrush of ambient air that would otherwise occur. In one embodiment, where the opening defines a plane that is in a substantially vertical orientation, the non-uniform flow distribution is tailored to deliver a greater flow rate to the bottom half of the opening than to the top of the opening. Implementing the flow rates and velocity profiles disclosed herein has been demonstrated to maintain the relative humidity within the substrate container substantially below a target value of 15%, even when the door to the substrate container is unsealed and removed from the opening.

Structurally, in one embodiment, a system for transporting substrates is disclosed, comprising a substrate container including an opening for insertion/removal of substrates and a door adapted to sealably cover the opening, the opening being on a plane that is substantially parallel to a vertical direction. A diffuser assembly is disposed within the substrate container that is adapted to admit a gaseous working fluid to the interior of the container, the diffuser being oriented to direct the gaseous working fluid toward the opening for purging the substrate container with the gaseous working fluid. In one embodiment, the diffuser assembly is configured to direct the gaseous working fluid at a greater velocity towards a lower half of the opening than towards an upper half of the opening. The diffuser is can be disposed proximate a back portion of the container, the back portion being opposite the opening.

The diffuser includes an inlet tower adapted to be mounted to the substrate container for admitting the gaseous working fluid to the interior of the container. The inlet tower can include a first end that defines a flow inlet and a blind end opposite the first end, the inlet tower defining an interior flow passage that extends from the flow inlet to the blind end and including a porous outer sleeve in fluid communication with the interior flow passage. The inlet tower can further include at least one flow obstruction disposed along the interior flow passage between the flow inlet and the blind end. In one embodiment, the at least one flow obstruction is a flow orifice.

Embodiments provide a porous tower diffuser assembly comprising a fitting with an offset portion with an upwardly extending nipple and a diffuser tower connected to the nipple. The diffuser tower tube may have a flared fitting that extends over the upwardly facing nipple. In embodiments, the porous tower diffuser assembly may be provided as a kit to retrofit front opening wafer containers for providing enhanced purge performance.

Various embodiments of the disclosure generate a flow distribution that sweeps closely along the floor of a substrate container upon removal of the access door. The sweeping of the floor tends to counter the inrush of ambient air that would otherwise occur.

When a substrate container is purging in front of a mini-environment, the door of the container is removed and there is a down flow of humid air in front of the open shell. This down flow of air tend to enter the substrate container at the lower wafer slots making them more difficult to purge. Moreover, existing inlet fittings to which tower diffusers are connected often minimize or eliminate flow at the connection. If purge flow enters the bottom of the diffuser (most typical), this low or no-flow at the connection compounds the challenge of purging the lower wafer slots because the air entering the substrate container at the lower wafer slots is not directly confronted.

Accordingly, various embodiments disclose structures and methods for purging substrate containers with enhanced flow at the lower wafer slots in order to effectively purge the high flow of air entering the substrate container at these locations.

Structurally, various embodiments disclose an inlet fitting for a porous tower diffuser assembly for use in a substrate container, the inlet fitting comprising a base portion defining an axial aperture that passes therethrough, a nipple that extends from a first face of the base portion and defines a central passageway that is in fluid communication with the axial aperture of the base portion, the nipple including a wall portion and structure defining a lateral aperture that passes through the wall portion, and a porous media diffuser operatively coupled with the nipple. The porous media diffuser includes an openly porous sidewall portion and defines a diffuser passageway that extends into the porous media diffuser along a diffuser axis. The diffuser passageway defines an opening at a proximal end of the porous media diffuser and can be concentric with the central passageway of the nipple. In one embodiment, the nipple extends into the opening of the diffuser passageway so that the porous media diffuser subtends the lateral aperture.

In one embodiment, the base portion is centered about a first axis normal to the first face of the base portion, the central passageway of the nipple defines a second axis that is substantially parallel to the first axis, and the second axis is radially offset from the first axis. The axial aperture of the base portion can also define a third axis that is substantially parallel to the first axis, and the third axis can be radially offset from the first axis and the second axis.

In various embodiments, the nipple is a barbed nipple including a barbed portion and a tapered portion of the wall portion, the barbed portion defining a major outer diameter of the barbed nipple, the tapered portion defining a reduced outer diameter adjacent the barbed portion. The lateral aperture can passes through the tapered portion of the wall portion. In one embodiment, an annular plenum is defined between the tapered portion of the barbed portion and a boundary of the diffuser passageway of the of the porous media diffuser, the annular plenum being in fluid communication with the central passageway of the barbed nipple via the lateral aperture.

In some embodiments, the wall portion of the nipple includes external threads formed on an external surface thereof. The proximal end of the porous media diffuser can include internal threads formed on an internal surface thereof, the internal threads being compatible with the external threads of the nipple.

In various embodiments of the disclosure, an inlet fitting for a porous tower diffuser assembly for use in a substrate container comprises a purge module for installation in a floor of the substrate container, the purge module including a housing having a tubular portion and a top portion, the top portion including structure defining an aperture that passes therethrough, the aperture defining and being concentric about a central axis. A coupling can be disposed in the housing, the coupling defining a through passage that is substantially concentric with the central axis of the aperture of the top portion. The coupling can depend from the top portion of the housing of the fitting. These embodiments further comprise a porous media diffuser having a proximal end that is operatively coupled with the coupling and extends through the aperture of the top portion of the purge module, the porous media diffuser including an openly porous sidewall portion and defining a diffuser passageway that extends into the porous media diffuser, the diffuser passageway defining an opening at the proximal end of the porous media diffuser, the opening being substantially concentric about the central axis of the aperture. A portion of the porous media diffuser that is flush with and extends immediately above the aperture is of a porous material. The coupling can be a female coupling, and can be a threaded female coupling. In one embodiment, the proximal end of the porous media diffuser includes external threads on an external surface thereof, the external threads being compatible with the threaded female coupling.

BRIEF DESCRIPTION OF THE FIGURES

FIG. 1 is a perspective view of a substrate container in an embodiment of the disclosure;

FIGS. 2A and 2B are visualizations of ambient air entering an open substrate container (A) with no substrates present and (B) with five substrates distributed within.

FIG. 5 is a schematic depiction of a first tower diffuser assembly of the prior art;

FIG. 6 is a schematic depiction of a tower diffuser assembly that produces a flow velocity profile having greater flow velocities in the lower regions than in the upper regions in an embodiment of the disclosure;

FIG. 7 is a perspective, sectional view of a diffuser including a flow orifice as an internal flow restrictor in an embodiment of the disclosure;

FIGS. 8A and 8B are graphs depicting the time-elapsed reduction of humidity within an open substrate container for (A) a nitrogen gas purge and (B) a clean dry air purge in embodiments of the disclosure;

FIG. 11A is a perspective, sectional view of a reverse flow diffuser utilizing an interior feed line in an embodiment of the disclosure;

FIG. 11B is a partial, enlarged view of the distal end of the reverse flow diffuser of FIG. 11A in an embodiment of the disclosure;

FIG. 12 is a schematic depiction of a tower diffuser assembly implementing a plenum-type diffuser body;

FIG. 13 is a perspective view of a composite diffuser in an embodiment of the disclosure;

DETAILED DESCRIPTION OF THE FIGURES

Figures 3A, 3B:
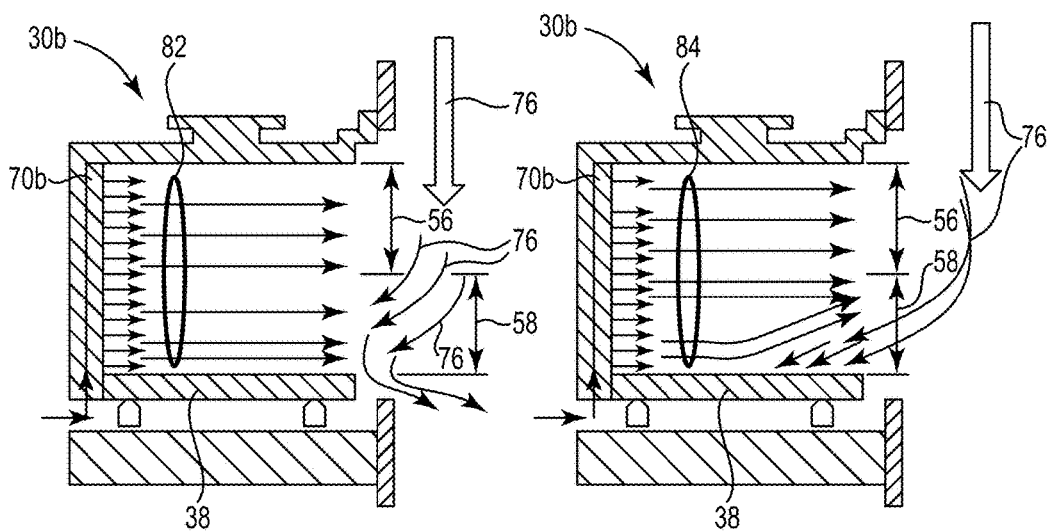
FIGS. 3A and 3B are sectional schematics depicting the interaction between ambient air and the interior of an open substrate container with conventional diffusers utilizing (A) a clean dry air purge gas, and (B) a nitrogen purge gas.

Referring to FIG. 1, a substrate container 30 for storing substrates 32 is depicted in an embodiment of the disclosure. The substrate container 30 includes two opposing side portions 34, a top portion 36, a bottom portion 38 and a back portion 42. The bottom portion 38 defines an interior surface or floor 40. A front portion 44 of the substrate container 30 includes a door frame 46 that defines an opening 48. A door 52 is adapted to sealably cover the opening 48. The opening 48 of the substrate container 30 lies on a plane that is substantially parallel to a vertical direction 54. The substrate container 30 is also characterized as containing a microenvironment 64.

A pair of slotted sidewalls 66 are disposed within the substrate container 30, each being proximate a respective one of the side portions 34. The slotted sidewalls 66 are aligned so that the slots face each other to define a plurality of slot positions 68, and are spaced apart so that the substrate(s) 32 are supported therebetween. For purposes of this disclosure, the lower most of the slot positions 68 (i.e., the slot closest to the bottom portion 38) is identified as the "first" slot, with the slot numbers increasing in the upward direction (FIG. 15B).

The substrate container 30 further includes at least one diffuser assembly 70 disposed within the substrate container 30 and operatively coupled to a gas source (not depicted) for introduction of a gaseous working fluid into the substrate container 30. In certain embodiments, one or more of the diffuser assemblies 70 are oriented to direct the gaseous working fluid toward the opening 48 in order to purge the substrate container 30.

Referring to FIGS. 2A and 2B, flow visualizations 72 and 74 are presented, illustrating the entry of ambient air 76 entering a substrate container 30a upon removal of the door 52. The substrate container 30a has many of the same aspects of the substrate container 30, but did not activate the diffusers 70 when the flow visualizations 72 and 74 were acquired. For the flow visualization 72, the substrate container 30a is empty (i.e., no substrates mounted within); for the flow visualization 74, the substrate container 30a included five substrates uniformly distributed from the lower-most (first) slot to the upper-most slot. The flow visualizations 72 and 74 were generated by introducing a smoke medium 78 into the enclosed, transparent substrate container 30a that became distributed substantially uniformly throughout the substrate container 30a. The smoke medium 78 was then illuminated through the transparent walls of the substrate container 30a. Upon removing the door 52 from the substrate container 30a, the inrush of ambient air can be visualized by the displacement of the smoke medium 82. Accordingly, the smoke medium 82 represents the conditioned (e.g., cleaned, inert and/or low humidity) gas of the microenvironment 64, while the zones where the smoke medium 82 is absent represents the encroaching, unconditioned ambient air 76.

The flow visualizations 72 and 74 indicate that ambient air 76 enters the substrate container 78 near a bottom portion 38. This trend is observed both with the empty substrate container and with substrates mounted therein.

Referring to FIGS. 3A and 3B, qualitative results of a purging experiment for an open substrate container 30b is schematically depicted for two different purge gases: clean dry air purge gas 82 (FIG. 3A) and nitrogen purge gas 84 (FIG. 3B). The substrate container 30b has many of the same aspects of the substrate container 30 which are indicated by like-numbered numerical references, and implemented a diffuser assembly 70b that generated a vertical flow profile that delivered a higher gas velocity at the distal or upper portions of the diffuser assembly 70b than at the proximal or lower portions (see, e.g., FIG. 5). The portrayals of FIGS. 3A and 3B were observed using visualization with smoke/fog (akin to FIGS. 2A and 2B), but are presented schematically for clarity. For these experiments, the relative humidity of the ambient air 76 was approximately 45%, while the relative humidity of the clean dry air 82 and the nitrogen gas 84 were near 0%. The temperatures of the gases 76, 82 and 84 were approximately 22° C. Two tower diffusers 70b were utilized, such as depicted in FIG. 1, with the flow rate through each diffuser set at 100 liters per minute (lpm).

The depiction of FIG. 3A illustrates that the ambient air 76 is substantially repulsed when the substrate container 30b is purged with the clean dry air 82 under the conditions described. The clean dry air 82 is of substantially the same density as the ambient air 76, or even slightly denser in the aggregate than the ambient air 76 because of the absence of water vapor (water vapor being of lighter molecular weight than the composition of standard air). Thus, it is believed that the clean dry air 82 that is introduced along the bottom portion 38 of the substrate container 30b remains close to the surface of the bottom portion 38, thereby countering the inrush of ambient air 76 that would otherwise occur.

In contrast, the depiction of FIG. 3B illustrates that the nitrogen gas 84 introduced through the diffuser assembly 70b that is proximate the bottom portion 38 has a tendency to rise over the encroaching ambient air 76 as the nitrogen gas 84 approaches the opening 48, so that blockage of ambient air 76 is partial rather than substantially complete. The ambient air 76 includes constituents that are of greater molecular mass than nitrogen (e.g., oxygen). Thus, it is believed that the denser ambient air 76 that is introduced along the bottom portion 38 of the substrate container 30b remains close to the surface of the bottom portion 38, such that the inrush of ambient air 76 is not effectively blocked under the conditions of the experiment of FIG. 3B.

Figure 4:
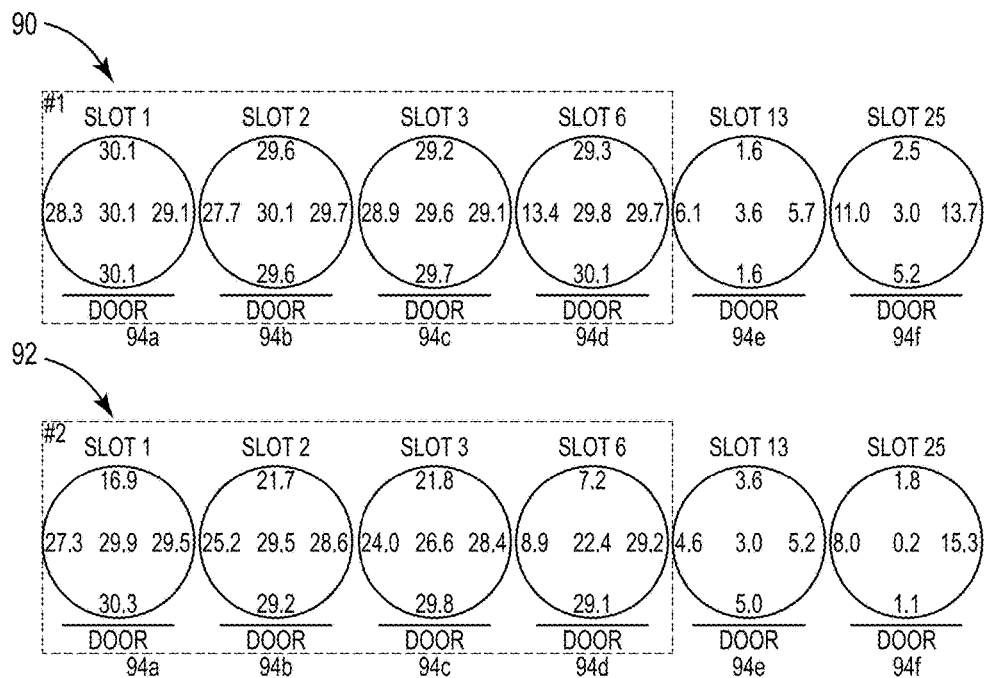
FIG. 4 presents relative humidity measurement data taken at different locations on substrates loaded in the substrate container for a nitrogen purge using a conventional diffuser.

Referring to FIG. 4, graphs 90 and 92 are presented that quantifies the encroachment of humidity into the substrate container 30b when using nitrogen gas 84 as the gaseous working fluid. A plurality of blank disks 94a through 94f, each dimensioned to be representative of a substrate, were each instrumented with relative humidity indicators at the center, front edge, rear edge and side edges. The substrates 94a through 94f were then loaded into slots 1 through 3 (slot 1 being the lower-most slot and slots 2 and 3 being the next two slots above the lower most slot), slot 6 (located at approximately ¼ of the height of the slotted sidewalls 66), slot 13 (located at approximately ½ of the height of the slotted sidewalls 66), and slot 25 (the uppermost slot for substrate container 30b). An experiment was then run with the disks in place and utilizing nitrogen gas 84 as the gaseous working fluid (i.e., a repeat of the experimental conditions attendant to the discussion of FIG. 3B). The experiment was repeated to demonstrate repeatability of results. Both sets of data are presented in FIG. 4

The results presented in FIG. 4 show that the disks 94a through 94d residing in slots 1-3 and 6 detected substantially higher relative humidity levels than the disks in slots 13 and 25. The disks 94a through 94d consistently include relative humidity indications greater than 20% and in some instances greater than 30%. In contrast, disks 94e and 94f had relative humidity indications that are consistently below 20% and, with the exception of one reading, are less than 15%.

Accordingly, the velocity profile from the conventional diffuser and other purge operating conditions that produced the results presented in FIG. 4 are believed to be inadequate for maintaining the substrate container 30b at humidity levels below 15% relative humidity.

Referring to FIG. 5, the dynamics of a standard tower diffuser assembly 100 of the prior art is explained. The diffuser assembly 100 is characterized as having a constant internal flow cross-section 102, a uniform exit flow structure 104 (e.g., uniform porosity and thickness) along the flow length 106 of the diffuser assembly 100, and a blind end 108 that terminates the flow cross-section 102. A purge gas 112 that enters and passes through the diffuser assembly 100 is presumed to be incompressible (i.e., relatively low total pressures) and adiabatic, such that the flow can be characterized by the Bernoulli equation:

$$P\text{total} = P1 + Q1 = P1 + \tfrac{1}{2} \square \square \square V1^2 \qquad \text{Eq. (1)}$$

$$P\text{total} = P2 + Q2 = P2 + \tfrac{1}{2} \square \square \square V2^2 \qquad \text{Eq. (2)}$$

where Ptotal is the total pressure (substantially constant throughout the diffuser assembly 100), P1 is the static pressure at a location I in the diffuser assembly 100, Q1 is the dynamic pressure at location 1, $\square$ is the density of the resident gas (substantially constant throughout the diffuser assembly 100), V1 is the internal flow velocity at location 1, P2 is the static pressure at a location 2 in the diffuser assembly 100, Q2 is the dynamic pressure at location 2, V2 is the internal flow velocity at location 2, and location 2 is downstream of location 1. The depiction of FIG. 5 also presents exit velocities V1' and V2' (i.e. the velocity of the gas exiting the diffuser at locations 1 and 2, respectively) and the ambient pressure Po surrounding the diffuser assembly 100.

Another characteristic of the diffuser assembly 100 is that the exit flow structure 104 is configured so that a pressure drop $\square$P through the exit flow structure 104 is not substantial relative to static pressures P1 and P2.

It has been observed that, for the diffuser assembly 100, the exit velocity V2' is greater than the exit velocity V1'. It is believed that the internal flow velocity slows as the flow stream of the purge gas 112 approaches the blind end 108, such that the internal flow velocity V1 is greater than the internal flow velocity V2, thereby causing the dynamic pressure Q1 to be greater than the dynamic pressure Q2. Because Ptotal is constant, the higher dynamic pressure Q1 relative to the dynamic pressure Q2 reduces the static pressure P1 relative to the static pressure P2. Because the exit velocities V1' and V2' are driven by the static pressures P1 and P2, respectively, the exit velocity V1' will be less than the exit velocity V2. Accordingly, the velocity profile for the conventional diffuser assembly 100 generates a non-uniform exit velocity profile 114 that increases along the flow length 106 (i.e., generates higher velocities at the upper or distal end near the blank end than at the lower or proximal end near the bottom portion 38 of the substrate container 30).

Referring to FIG. 6, a diffuser assembly 140 is depicted that includes characteristics of certain embodiments of the disclosure. The guiding principle of the diffuser assembly 140 is to invert the internal flow characteristics such that V2 is greater than V1, thereby producing a velocity profile 142 where V1' is greater than V2'. In this way, the gaseous working fluid sweeps across the bottom portion 38 and through the lower half 56 of the opening 48 of the substrate container 30 with greater force and momentum than through the upper half 58 of the opening 48. Below are various embodiments configured to achieve this dynamic.

Referring to FIG. 7, a diffuser assembly 160 including an internal flow restrictor 162 is depicted in an embodiment of the disclosure. The diffuser assembly 160 comprises a proximal segment 164 and a distal segment 166 separated by the internal flow restrictor 162. Each segment comprises a diffuser body 168 with walls 172 that define an exit flow structure 174 (e.g., an open porous structure or a plurality of apertures) that enables gaseous working fluid to exit radially through the diffuser body 168.

In one embodiment, the diffuser body 168 is formed of a POREX porous polyethylene material, item TUB-5361, supplied by the Porex Corporation of Fariburn, Ga., USA. The characteristics of this item include a nominal outer diameter of ½ in., a nominal inner diameter of 0.29 in., with an exit flow structure 174 that includes an average pore size of 15 to 30 $\square$m, and a porosity in the range of 30% to 40% inclusive. It is understood that, while this diffuser body was utilized for various studies and for experimental results presented herein, the specific structure of the POREX tube utilized is merely representative and non-limiting.

The exit flow structure 174 can be uniform throughout the length of the respective segment 164 or 166, or uniform across both segments 164 and 166. The diffuser body 168 can further define a flow cross-section 175 that is uniform throughout the length of the respective segment 164 or 166, and/or uniform across both segments 164 and 166. The distal segment 166 is capped at a distal end 176 by a blind end 178. The blind end 178 can be, but need not be, solid and impermeable. In one embodiment, the internal flow restrictor 162 includes a flow orifice 182, as depicted in FIG. 7.

Functionally, the flow orifice 182 induces a head loss between the proximal segment 164 and the distal segment 166 of the diffuser assembly 160. The head loss reduces a total pressure PT2 within the distal segment 166 relative to a total pressure PT1 within the proximal segment 164. Attendant to the reduction of the total pressure PT2 is a reduction in a static pressure PS2 in the distal segment 166 relative to a static pressure PS1 within the proximal segment 164. Accordingly, as explained above, the reduction in the static pressure of the distal segment 166 causes an attendant reduction in the exit velocity V2' of the flow exiting the distal segment 166 relative to the exit velocity V1' of the proximal segment 164. In this way, the exit velocity V1', which is proximate the bottom portion 38 of the substrate container 30, is greater than the exit velocity V2' that flows in the upper portions of the substrate container 30.

Referring to FIGS. 8A and 8B, graphs 202 and 204 of experimental data that demonstrates the efficacy of the diffuser assembly 160 are presented in an embodiment of the disclosure. Both graphs 202 and 204 present the time vs. the relative humidity within a substrate container akin to substrate container 30 with the door 54 removed and utilizing the diffuser assembly 160 to purge the substrate container and to maintain the relative humidity below 15%. The results presented in graph 202 are based on a nitrogen gas purge; the results in graph 204 are based on a clean dry air purge. The experiments that generated both sets of data utilized two diffusers (as depicted in FIG. 1), each diffuser delivering 100 lpm of gaseous working fluid into the substrate container. Both graphs 202 and 204 also present data from the front locations of instrumented disks located in slot 3 and in slot 6 of the wafer container. These disk locations and substrate container slot locations were selected because various other tests conducted in support of this work demonstrated that front locations in the lower wafer slot locations appeared most challenging to purge in fog visualization and relative humidity testing.

For each experiment, the door 52 of the wafer carrier 30 was opened and the microenvironment allowed to be flooded with ambient air 76 having a relative humidity of 45% (typical of clean rooms for substrate handling). In both graphs 202 and 204, the gaseous working fluid was introduced via the diffusers 160 at approximately 300 seconds into the graph. The disk at slot 6 shows a substantially steady, monotonic decrease in relative humidity, regardless of which gaseous working fluid was implemented. The disk at slot 3 also decreased monotonically when clean dray air was utilized as the gaseous working fluid (FIG. 8B). These data all approach 0% relative humidity at the 600 second time mark (i.e., about 300 seconds after introduction of the gaseous working fluid).

The disk at slot 3 for the nitrogen gas purge did not monotonically decrease, nor did the relative humidity approach 0%. Instead, the relative humidity levels at the front of slot 3 is somewhat unsteady, indicating that there is some intermittent encroachment of ambient air into the open substrate container.

Nevertheless, the results indicate that the diffuser assembly 160 works satisfactorily. The relative humidity crosses below the targeted 15% relative humidity threshold less than 10 seconds into the purge cycle and never exceeds the 15% relative humidity mark thereafter. Accordingly, the data of graphs 202 and 204 verify that the efficacy of the diffuser assembly 160 where either nitrogen or clean dry air is used as the gaseous working fluid.

Figure 9A:
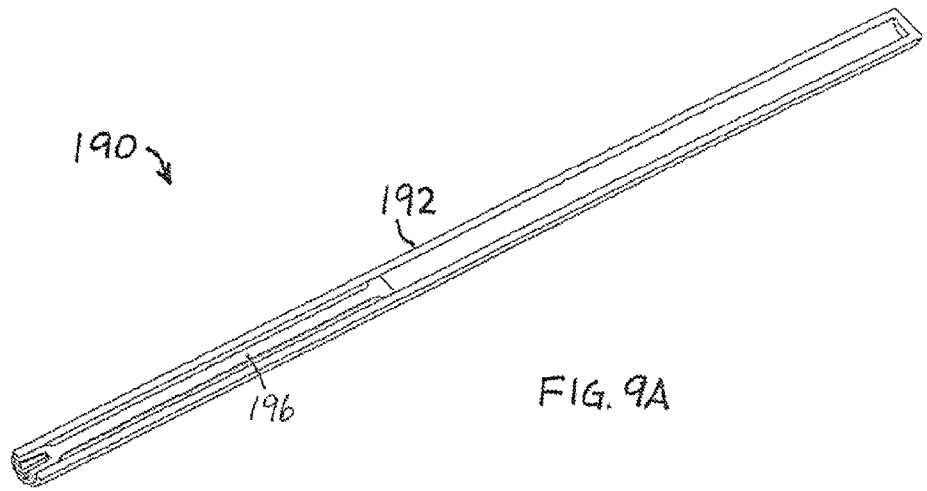
FIG. 9A is a perspective, sectional view of a diffuser including a centered disk as an internal flow restrictor in an embodiment of the disclosure.
Figure 9B:
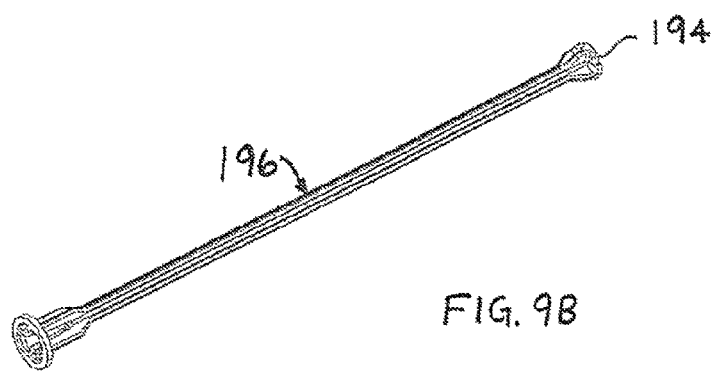
FIG. 9B is a perspective view of a support structure for the centered disk of FIG. 9A in an embodiment of the disclosure.

Referring to FIGS. 9A and 9B, a diffuser assembly 190 implementing the flow restrictor principle is depicted in an embodiment of the disclosure. The diffuser assembly 190 comprises a single diffuser body 192 into which a centered disk 194 supported by an inlet stem assembly 196 is inserted. The diffuser body 192 can include many of the same attributes as the proximal and distal segments 164 and 166 of the diffuser assembly 160 (e.g., walls that define an exit flow structure; internal flow passage with uniform flow cross-section; blind end). The centered disc 194 and inlet stem assembly 196 cooperate with the diffuser body 192 to define semi-annular passages 198 that restrict the flow and induce a head loss. Accordingly, the diffuser assembly 190 operates under the same principles as the diffuser assembly 160, and can produce the same "step" in the profiles of the exit velocity.

It is noted that neither the diffuser assembly 160 nor the diffuser assembly 190 are limited to a single internal flow restrictor. That is, a plurality of flow restrictors (not depicted) can be implemented to produce a series of reduced pressures along the length of these diffuser assemblies 160 and 180, thereby creating a multi-step external velocity profile.

Figure 10:
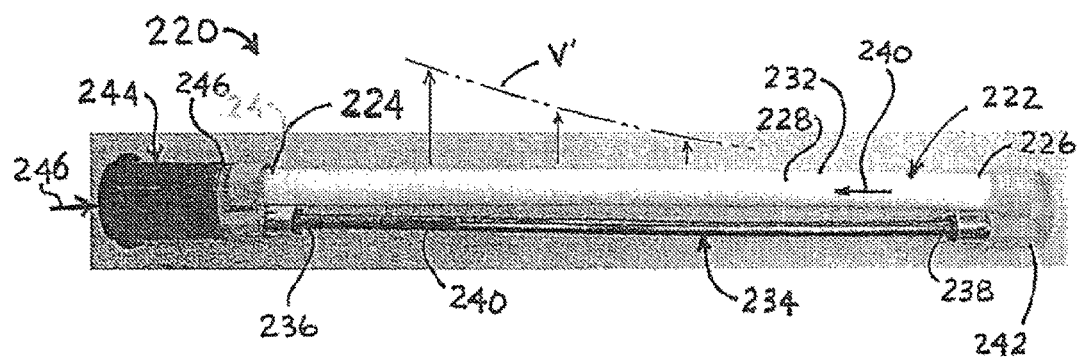
FIG. 10 is a perspective view of a reverse flow diffuser utilizing an exterior feed line in an embodiment of the disclosure.

Referring to FIG. 10, a reverse flow diffuser assembly 220 is depicted in an embodiment of the disclosure. The reverse flow diffuser assembly 220 includes a diffuser body 222 having a proximal end 224 and a distal end 226 and including a wall 228 that defines an exit flow structure 232 (e.g., an open porous structure or a plurality of apertures) that enables gaseous working fluid to exit radially through the diffuser body 222. In one example and non-limiting embodiment, the diffuser body 222 is formed of the POREX porous polyethylene material described above, or having characteristics similar thereto.

A feed line 234 having a proximal end 236 and a distal end 238 is located adjacent to and substantially parallel with the diffuser body 222. Unlike the diffuser body 222, the feed line 234 is not structured to facilitate a radial flow therethrough; rather, the wall of the feed line 234 is solid, such that a flow stream 240 entering the proximal end 236 exits the distal end 238.

The respective distal ends 226 and 238 of the diffuser body 222 and the feed line 234 are in fluid communication, for example by way of a U-shaped. fitting 242. An inlet fitting 244 can be coupled to the proximal ends 224 and 236 of the diffuser body 222 and the feed line 234. In the depicted embodiment, the inlet fitting 244 is in fluid communication with the proximal end 236 of the feed line 234 while providing a blind end 246 at the proximal end 224 of the diffuser body 222. The fitting 244 can also be adapted for coupling within a port (not depicted) that is formed at the bottom portion 38 of the substrate container 30.

In operation, a purge gas 246 is introduced into the inlet fitting 244, which routes the purge gas 246 into the feed line 234. The purge gas passes through the feed line 234 and U-shaped fitting 242, where the flow is reversed and enters the distal end 226 of the diffuser body 222. The purge gas 246 then exits the diffuser body 222 radially through the wall 228 via the exit flow structure 232.

Functionally, for diffuser bodies 222 having characteristics similar to the POREX porous polyethylene material described above, the velocity profile exiting the diffuser body 222 relative to the blind end 246 can be similar to the velocity profile 114 of FIG. 5 relative to the blind end 108. However, the reversal of the flow stream 240 causes an inversion of the velocity profile relative to the inlet of the diffuser assembly 220. That is, for the reverse flow diffuser assembly 220, the high velocities proximate the blind end 246 (i.e., the proximal end 224) of the diffuser body 222 are proximate the bottom portion 38 of the substrate container 30 are greater than the velocities proximate the top portion 36, such that the gaseous working fluid exits the lower half 56 of the opening 48 of the substrate container 30 with greater force and momentum than through the upper half 58 of the opening 48.

Referring to FIGS. 11A and 11B, a reverse flow diffuser assembly 260 is depicted in an embodiment of the disclosure. The reverse flow diffuser assembly 260 includes many of the same attributes as the reverse flow diffuser assembly 220, which are indicated with like-numbered numerical references. Structurally, the reverse flow diffuser assembly 260 differs from the reverse flow diffuser assembly 220 in that a the feed line 234 is located inside and is concentric with the diffuser body 222 about a central axis 262, to define an annular flow passage 264 between the feed line 234 and the diffuser body 222. Also, the proximal end 224 of the diffuser body 222 includes a plug 266 that terminates annular flow passage 264 and the distal end 226 of the diffuser body 222 includes a blind end 268, the distal end 238 of the feed line 234 being axially offset from the blind end 266.

Functionally, the blind end 268 acts to reverse the flow stream 240 exiting the feed line 234 and redirect it axially into the annular flow passage 264 (FIG. 11B). The plug 266 is effectively a blind end to the annular flow passage 264, so that purge gas entering the annular flow passage 264 exits the diffuser body 222 radially, via the exit flow structure 232. The reversal of the flow stream 240 and the blockage provided by the plug 266 at the proximal end 224 of the diffuser body 222 create a velocity profile exiting the diffuser body 222 having characteristics similar to the velocity profile of the reverse flow diffuser assembly 220.

The disclosed embodiments above create a non-uniform velocity profile based on the principle of a change in the static pressure along the length of the diffuser body. However, by altering this dynamic, diffuser assemblies can be tailored to provide a desired flow profile on a different principle, referred to herein as the "plenum charge effect," as described below.

Referring to FIG. 12, a tower diffuser assembly 280 implementing plenum-type diffuser body 282 is depicted. One difference between the diffuser body 282 and the diffuser bodies 168, 192 and 222 is that an exit flow structure 284 of the plenum-type diffuser body 282 is configured so that a pressure drop iP therethrough 124 is substantially greater than the static pressures P1 and P2. As such, the diffuser assembly 120 serves as a plenum within which the axial velocities V1 and V2 are small so that the total pressure Ptotal and the static pressures P1 and P2 are substantially the same. Thus, the "plenum charge effect" is facilitated when static pressure changes along the internal flow stream are insubstantial.

One way to implement the plenum charge effect is to utilize a plenum-type diffuser body 282 wherein the porosity of the plenum-type diffuser body 282 is decreased relative to that of the diffuser bodies 168, 192 and 222, thereby increasing the resistance to the radial outflow. Another way is to increase the thickness of the wall of the of the plenum-type diffuser body 282 relative to that of the diffuser bodies 168, 192 and 222, which also increases the resistance to the radial outflow. The dimension of the pore diameters can be reduced to the same effect. Still another way is to increase the internal flow cross-section of the plenum-type diffuser body 282 relative to that of the diffuser bodies 168, 192 and 222, thereby decreasing the velocity of the flow stream for a given volumetric flow rate. These parameters can be altered individually or in combination to produce the desired plenum charge effect.

Consider the plenum-type diffuser body 282 as having a constant internal flow cross-section 284, a uniform exit flow structure 284 (e.g., uniform porosity and thickness) along its length, and a blind end 288 that terminates the flow cross-section 284. For a tower diffuser assembly 280 that facilitates the plenum charge effect, an exit velocity profile 292 radially exiting the plenum-type diffuser body 282 would be substantially uniform. Thus, affecting a non-uniform velocity profile requires other tailoring. Plenum charge type embodiments implementing such other tailoring are described below.

Referring to FIG. 13, a segmented plenum-type diffuser assembly 300 is depicted in an embodiment of the disclosure. The segmented plenum-type diffuser assembly 300 includes a proximal end 302, a blind distal end 304, and, as depicted, three segments 306a, 306b, and 306c that are in fluid communication via a central passage 308 that lies along a central axis 312. The central passage 308 can define the same flow cross-section along the length of the assembly 300. However, in one embodiment, the segments 306a, 306b, and 306c each create a plenum charge effect and are each configured to have a unique exit flow structure 314a, 314b and 314c; that is, each of the segments 306a, 306b, and 306c have a unique combination of pore size, pore geometry, and porosity, such that the resistance to the radial outflow is different for each of the segments 306a, 306b, and 306c.

To affect an exit flow velocity profile 316 that delivers higher velocities at the proximal end 302 (i.e., at a location closest to the bottom portion 38 of the substrate container 30) than at the distal end 304, the exit flow structures 314a, 314b and 314c are tailored such that the resistance to radial outflow is greatest for segment 306c and least for segment 306a, with the resistance to radial outflow of the segment 306b falling therebetween.

It is noted that the depiction of three segments 306a, 306b, and 306c is non-limiting and is merely representation of a plurality of segments. More or less segments can be utilized in other embodiments.

Figures 14A, 14B, 14C:
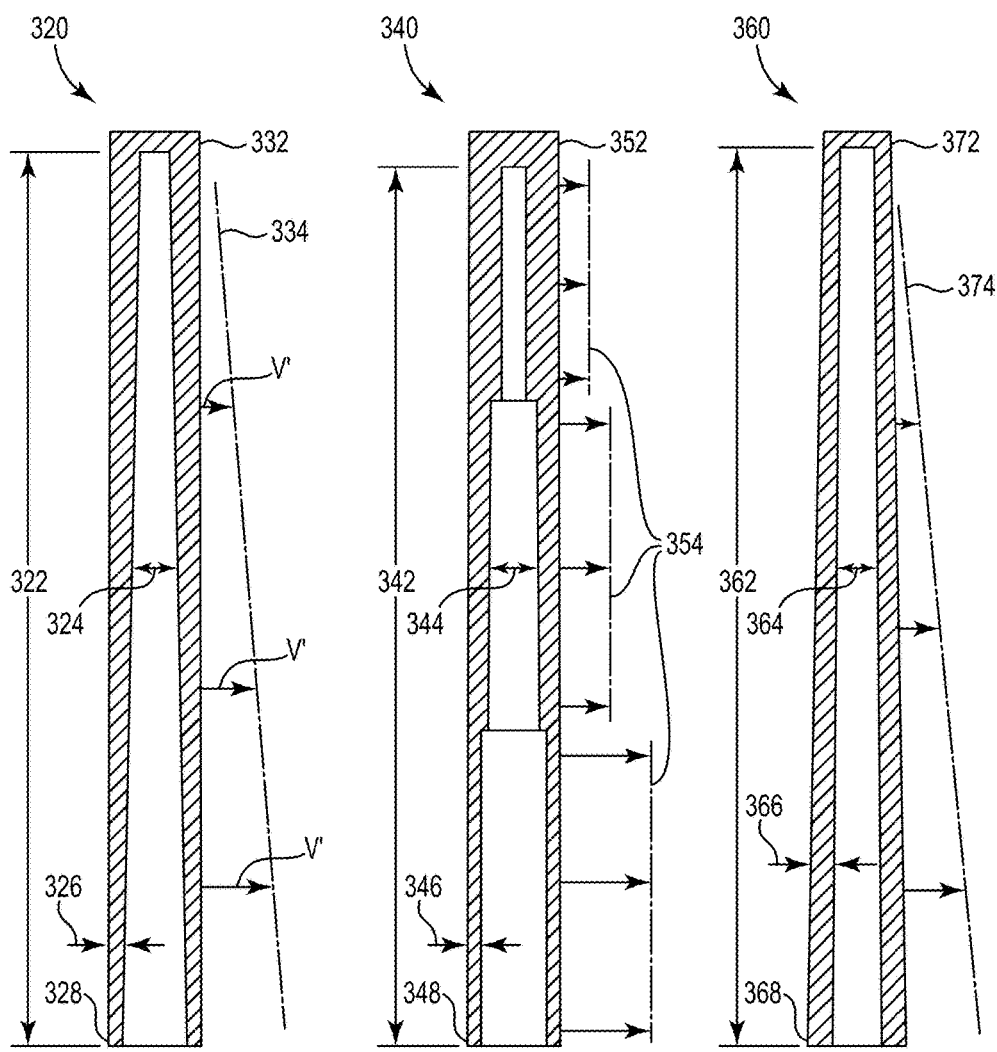
FIGS. 14A through 14C are sectional views of diffusers in embodiments of the disclosure.

Referring to FIGS. 14A, 14B and 14C, plenum-type diffuser assemblies 320, 340 and 360 are depicted, respectively, in embodiments of the disclosure. The pore size, pore geometry, and porosity of the plenum-type diffuser assemblies 320, 340 and 360 can be constant along their respective flow lengths 322, 342 and 362. Instead, the assemblies 320, 340 and 360 utilize a varying flow cross-section 324, 344 and 364, respectively, along their respective lengths 322, 342 and 362. The plenum-type diffuser assemblies 320 and 340 further implement a varying thickness 326 and 346 along their respective lengths 322 and 342.

Functionally, the plenum-type diffuser assembly 320 has a larger flow cross-section 324 and a thinner wall at a proximal end 328 than at a distal end 332. By this geometry, an exit velocity profile 334 can have higher velocities at the proximal end 328 than at the distal end 332. The plenum-type diffuser assembly 340, having a proximal end 348 and a distal end 352 and producing an exit velocity profile 534, operates on the same principle, but the changes to the flow cross-section 344 are in the form of discrete steps rather than the tapered geometry of flow cross-section 324. For the plenum type diffuser assembly 360 having a proximal end 368, a distal end 372, and producing an exit velocity profile 374, the wall thickness is substantially constant, such that the change in resistance to radial flow along its length relies primarily on the change to the flow cross-section 364.

Figure 15A:
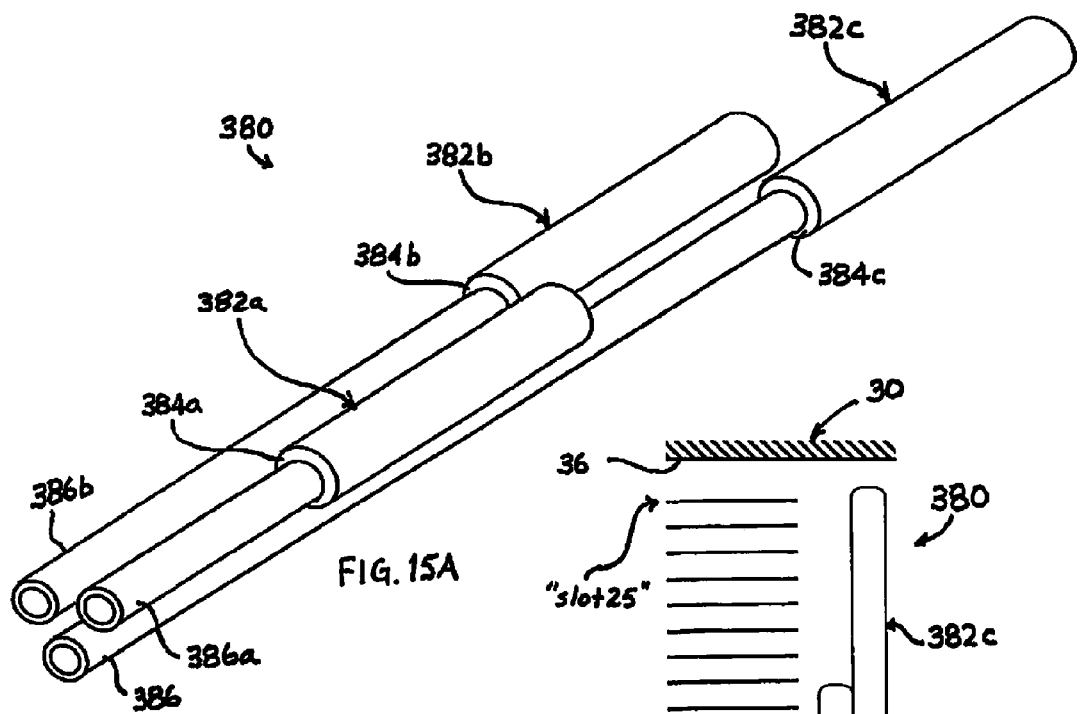
FIG. 15A is a perspective view of a plurality of diffusers operating in parallel in an embodiment of the disclosure.
Figure 15B:
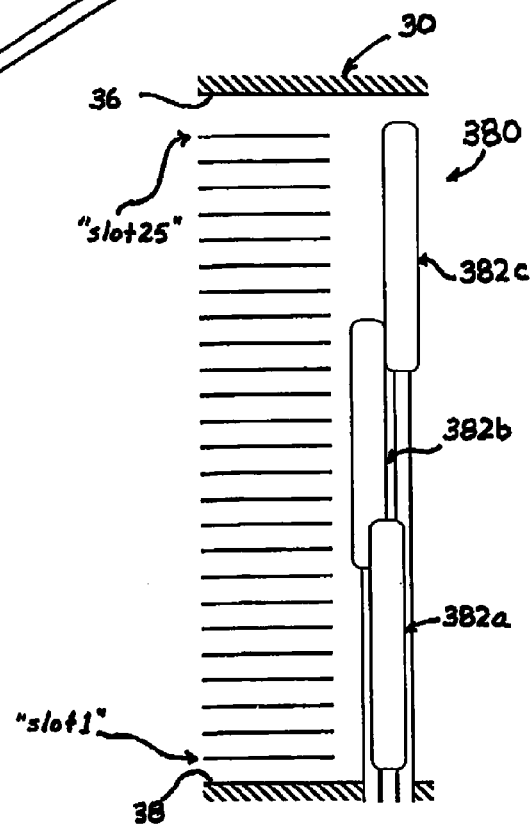
FIG. 15B is a partial elevation view of the plurality of diffusers of FIG. 15A and depicting the elevation locations of the substrates in an embodiment of the disclosure.

Referring to FIGS. 15A and 15B, a multiple diffuser assembly 380 is depicted in an embodiment of the disclosure. The multiple diffuser assembly 380 includes three individual diffuser bodies 382a, 382b, and 382c, each having a proximal end 384a, 384b, and 384c operatively coupled to a respective inlet tube 386a, 386b, and 386c, and each having a blind distal end 388a, 388b, and 388c.

In one embodiment, each diffuser body 382a, 382b, and 382c is configured as a plenum-type diffuser body, such that each generates a uniform velocity flow profile as depicted in FIG. 12. However, the resistance to radial outflow is different for each diffuser. In one embodiment, the diffuser body 382c presents a higher resistance to radial outflow, diffuser body 382a presents a lower resistance to radial outflow, and diffuser body 382b presents a resistance to radial outflow that falls therebetween. With diffuser body 382a being closest to the lower portion 38 of the substrate container 30, the gaseous working fluid sweeps across the bottom portion 38 and through the lower half 56 of the opening 48 of the substrate container 30 with greater force and momentum than through the upper half 58 of the opening 48 (FIG. 1).

In another embodiment, the diffuser bodies 382a, 382b, and 382c are each configured to produce a non-uniform velocity flow profile, such as depicted in FIG. 5. While such an arrangement does not necessarily provide the highest velocity immediately adjacent to the bottom portion 38, the diffuser body 382a can still be tailored to produce a nominal velocity that is greater than the nominal velocities output by the diffuser bodies 382b and 382c. In this way, the gaseous working fluid sweeps across the bottom portion 38 and through the lower half 56 of the opening 48 of the substrate container 30 with greater force and momentum than through the upper half 58 of the opening 48.

In other embodiments, each diffuser body 382a, 382b, and 382c is configured as a reverse flow diffuser assembly, such as depicted in FIG. 10 or 11. The diffuser body 382a can be tailored to produce a nominal velocity that is greater than the nominal velocities output by the diffuser bodies 382b and 382c. In this way, that the gaseous working fluid sweeps across the bottom portion 38 and through the lower half 56 of the opening 48 of the substrate container 30 with greater force and momentum than through the upper half 58 of the opening 48. Such an arrangement also provides the highest velocity immediately adjacent to the bottom portion 38 for enhances sweeping action.

In some embodiments, the inlets 386a, 386b, 386c can be in fluid communication with respective flow valves (not depicted) that can be adjusted to increase or decrease the relative flow rates passing through the respective diffuser body 382a, 382b, 382c. The adjustment of the flow rate can cause a varying exit velocity profile across the length of the multiple diffuser assembly 380, even in configurations where each diffuser body 382a, 382b, 382c have the same exit flow characteristics.

The depiction of FIG. 15B also presents the order of the slot locations relative to the top and bottom portions 36 and 38 of the substrate container 30.

It is noted that the depiction of three diffuser bodies 382a, 382b, and 382c is non-limiting and is merely representation of a plurality of diffuser bodies. More or less diffuser bodies can be utilized in other embodiments.

The diffuser assemblies disclosed above are all "tower type" diffusers. Other types of diffusers can also be implemented. For example, a plenum-type diffuser compartment (not depicted) could be disposed along the back portion 42 of the substrate container 30, for example in the form of a double wall having an interior wall portion adjacent the substrates. The interior wall could be porous or include apertures or venting slots. The porosity/aperture density could vary along the height of the interior wall such that there is a lower resistance to flow near the bottom portion 38 of the substrate container 30 than near the top portion 36. Charging of the plenum-type diffuser compartment could be facilitated through ports that pass through the bottom portion 38 of the substrate container 30 that are in fluid communication with the diffuser compartment.

Figure 16A:
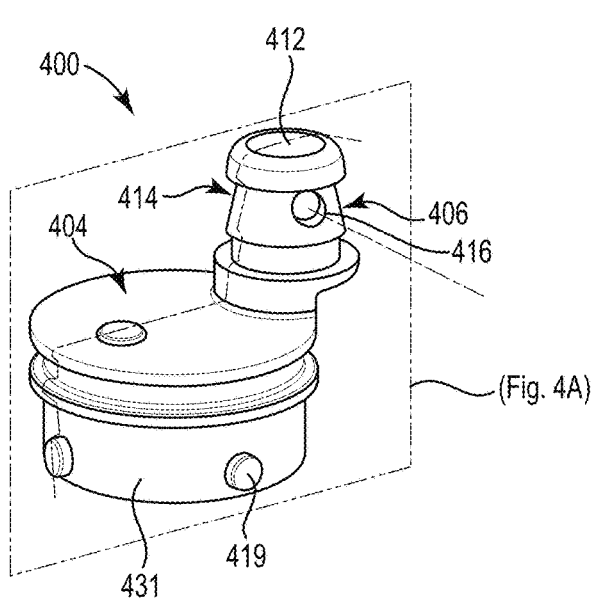
FIG. 16A is a perspective view of an inlet connector in an embodiment of the disclosure.
Figure 16C:
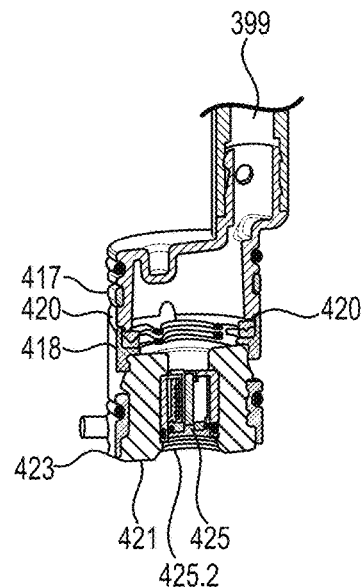
FIG. 16C is a sectional view of the inlet connector of FIG. 16A.
Figure 16B:
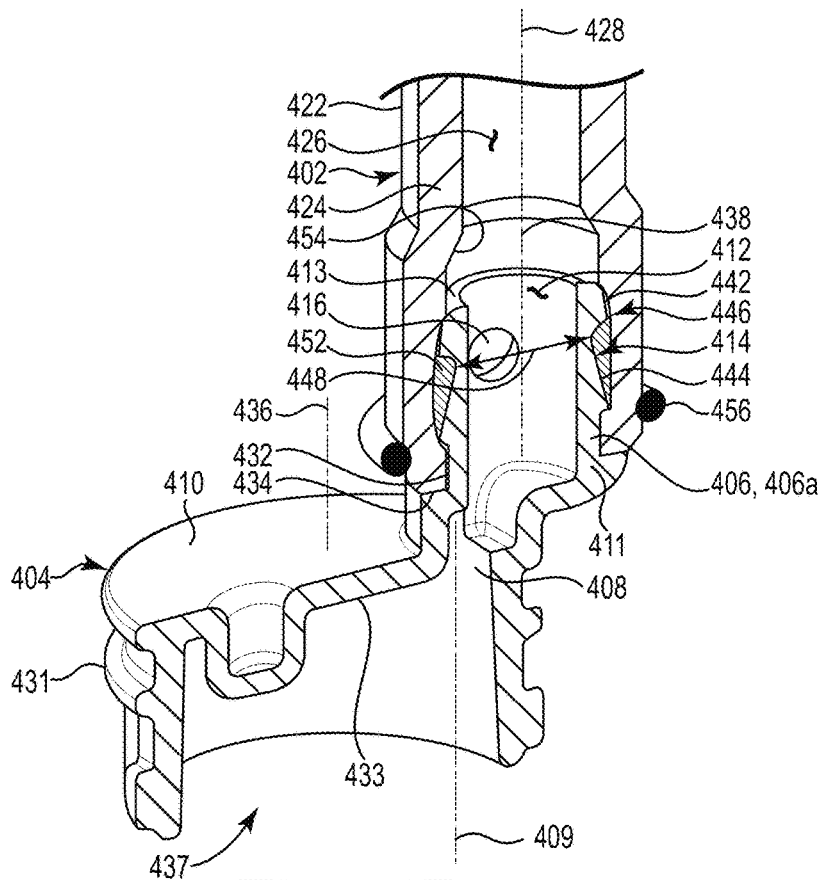
FIG. 16B is a sectional view of the inlet connector of FIG. 16A connected to a diffuser.

Referring to FIGS. 16A, 16B, and 16C portray an embodiment and components of a porous tower diffuser assembly 399. An inlet fitting 400 for coupling with a porous media diffuser 402 configured as a tubular tower is depicted in an embodiment of the disclosure. The inlet fitting 400 includes a base portion 404 defining an axial aperture 408 that passes through the base portion 404, the axial aperture 408 being centered about an aperture axis 409. A nipple 406 extends from a first face 410 of the base portion 404, the nipple 406 including a proximal end 411 and a distal end 413 and defining a central passageway 412 passing therethrough that is in fluid communication with the axial aperture 408 of the base portion 404. In one embodiment, the nipple 406 includes a wall portion 414 having structure defining a lateral aperture 416 that passes through the wall portion 414. The inlet fitting may connect to an upper socket 417 in a connecting portion 418 utilizing a "bayonet" type connection where nubs 419 engage slots 420 in the socket. A reslilient member 421 is secured in a lower socket 423 for engaging with purge nozzles. The resilient member may be configured as a grommet as illustrated and may have a check valve 425 positioned in a through hole 425.2 therein. The connecting portion may be a unitary part of a container portion of a front opening wafer container.

In various embodiments, the porous media diffuser 402 can be operatively coupled with the nipple 406. The porous media diffuser 402 can include a wall 422 that defines an open porous structure 424, enabling gaseous working fluid to exit radially through the porous media diffuser 402. The porous media diffuser 402 can be formed of the POREX porous polyethylene material, or having characteristics similar thereto.

The porous media diffuser 402 can define a diffuser passageway 426 that extends into the porous media diffuser 402 along a diffuser axis 428. The diffuser passageway 426 can define an opening 432 at a proximal end 434 of the porous media diffuser 402, the opening 432 being concentric with the central passageway 412 of said nipple 406. The porous media diffuser 402 can include a flared portion 427 at the proximal end 434, the flared portion having an inner diameter and/or an outer diameter that is larger than that of the porous media diffuser 402 distal thereto. The nipple 406 extends into the opening 432 of the diffuser passageway 426 so that the porous media diffuser 402 subtends the lateral aperture 416.

In some embodiments, a tubular portion 431 depends from a second face 433 of the base portion 404, the second face 433 being opposite the first face 410 of the base portion 404. In various embodiments, the base portion 404 is centered about a first axis 436 that is normal to the first face 410 of the base portion 404. The tubular portion can define an inlet port 437 that is also centered about the first axis 436. The central passageway 412 of the nipple 406 can define a second axis 438 that is substantially parallel to the first axis 436. In one embodiment, the second axis 438 is radially offset from the first axis 436.

In one embodiment, the nipple 406 is a barbed nipple 406a, including a barbed portion 442 at the distal end 413 of the nipple 406a and a tapered portion 444 of the wall portion 414, the barbed portion 442 defining a major outer diameter 446 of the barbed nipple 406a, and the tapered portion 444 defining a locally minimum outer diameter 448 adjacent the barbed portion 442. The lateral aperture 416 passes through the tapered portion 444 of the wall portion 414. An annular plenum 452 is defined between the tapered portion 444 of the barbed portion 442 and a boundary 454 of the diffuser passageway 426 of the porous media diffuser 402, the annular plenum 452 being in fluid communication with the central passageway 412 of the barbed nipple 406a via the lateral aperture 416. In various embodiments, an elastomeric band 456, such as an O-ring, is coupled near the proximal end 434 of the porous media diffuser 402 to help secure the porous media diffuser 402 to the nipple 406.

Figure 17A:
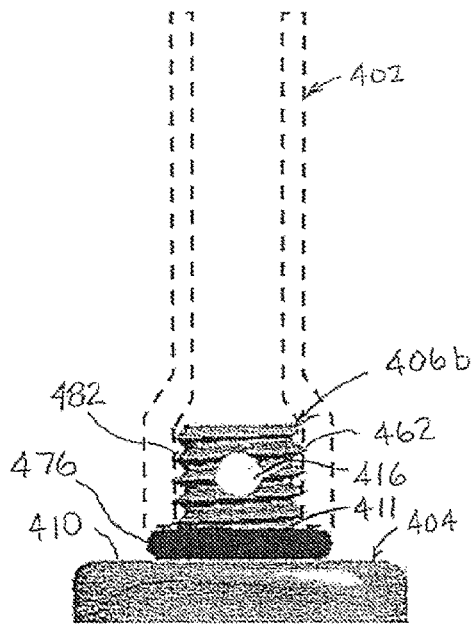
FIGS. 17A through 17D are elevation views of various nipple configurations in embodiments of the disclosure.
Figure 17B:
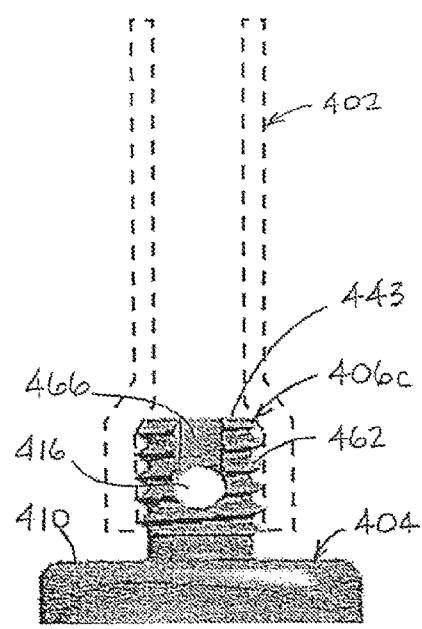
Figure 17C:
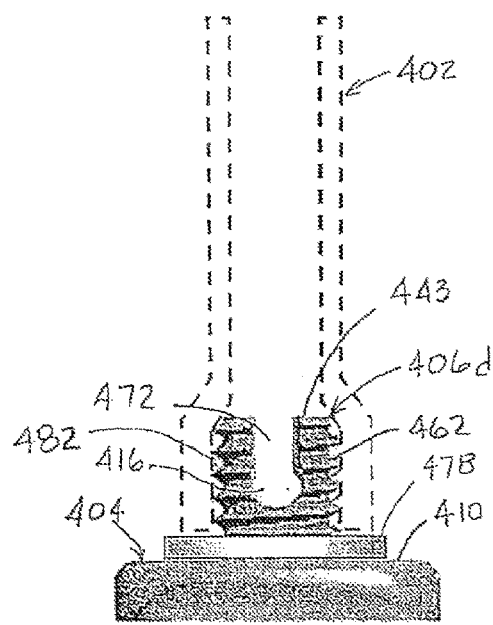
Figure 17D:
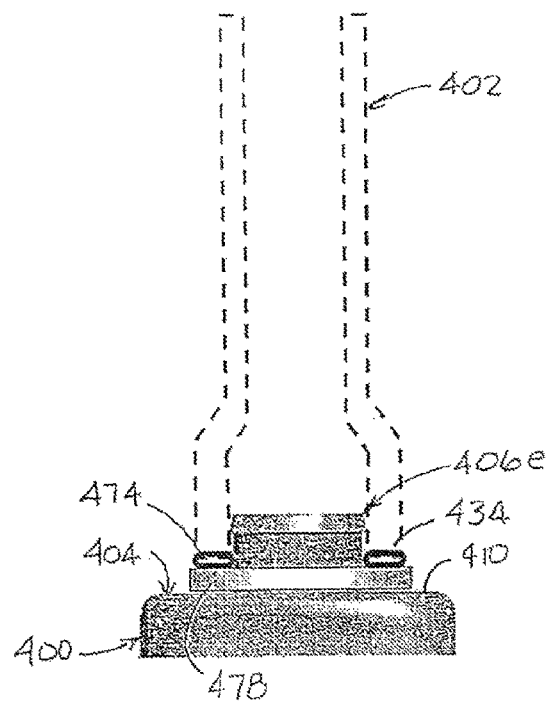

Referring to FIGS. 17A through 17D, other disclosed embodiments having nipples 406 that extend from the first face 410 of the base portion 404 are depicted. Herein, numerical reference 406 refers to the nipple(s) generically or collectively, while numerical reference 406 followed immediately by a letter suffix (e.g., 406a) refers to a specific nipple of the disclosure. Aspects common to the various nipples 406 are indicated with like-numbered numerical references. In one embodiment, a nipple 406b includes exterior threads 462 formed on an exterior surface 464 of the wall portion 416 of the nipple 406b, with the at least one lateral aperture 416 passing through the exterior threads 462 (FIG. 17A). In another embodiment, a nipple 406c also includes the exterior threads 462 and the at least one lateral aperture 416, with a channel 466 that extends from the at least one lateral aperture 416, traversing the exterior threads 462 via the channel 466 to the distal end 443 of the nipple 406c (FIG. 17B). In another embodiment, a nipple 406d includes structure defining a slot 472 that extends from the at least one lateral aperture 416 through the distal end 443 of the nipple (FIG. 17C). In one embodiment, a nipple 406e is shortened relative to the other nipples 406 and a glue joint or weld joint 474 disposed between the proximal end 434 of the porous media diffuser 402 and the inlet fitting 400 (FIG. 17D).

In various embodiments, and by way of non-limiting example, the lateral aperture 416 can have a diameter in the range of 3 mm to 12 mm and can be centered at a distance that is between 3 mm and 15 mm inclusive that is normal to the first face 410 of the base portion 404. For the nipple 406e of FIG. 17D, the distal end 413 can be located at a distance between 3 mm and 15 mm inclusive that is normal to the first face 410 of the base portion 404.

In various embodiments, an O-ring 476 is seated at the proximal end 411 of the nipple 406. The O-ring 476 can contact both the exterior surface 464 and the first face 410 of the base portion 404, as depicted in FIG. 16B. In some embodiments, a raised face 478 is formed or disposed at the proximal end 411 of the nipple 406, as depicted in FIGS. 17C and 17D. In certain embodiments, the boundary 454 of the diffuser passageway 426 of the porous media diffuser 402 includes structure defining interior threads 482 configured to mate with the exterior threads 462.

Figure 18A:
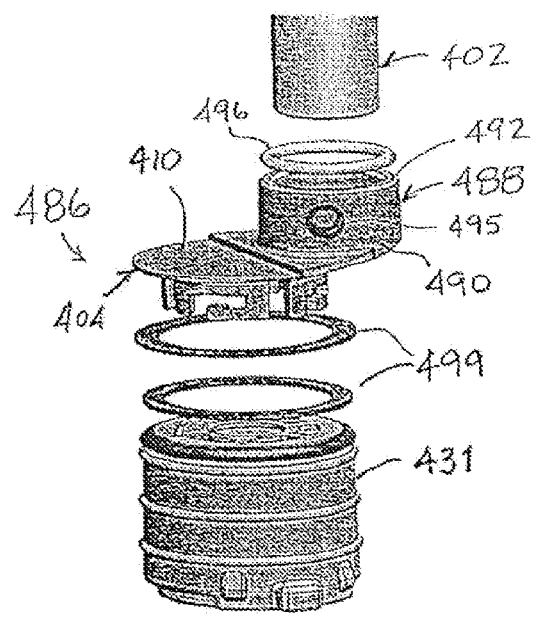
FIG. 18A is an exploded perspective view of an inlet fitting in an embodiment of the disclosure.
Figure 18B:
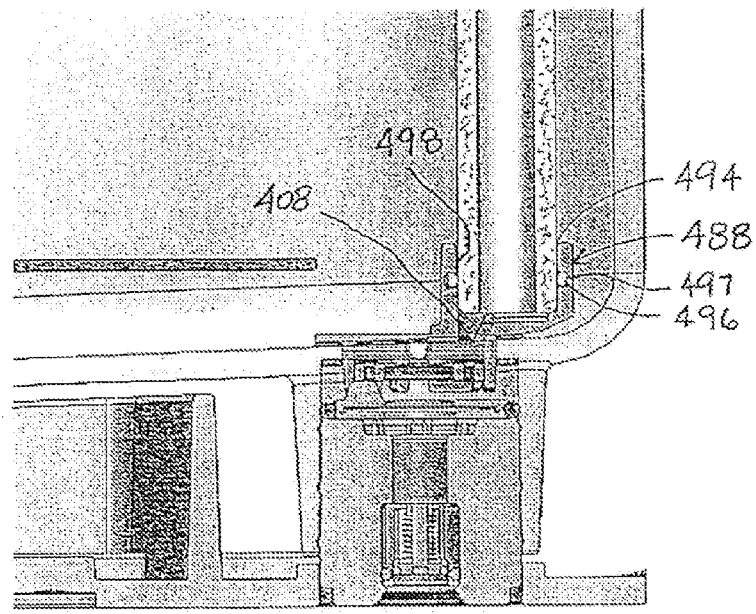
FIG. 18B is an assembled view of the inlet fitting of FIG. 18A in a substrate carrier.

Referring to FIGS. 18A and 18B, an inlet fitting 486 is depicted in an embodiment of the disclosure. The inlet fitting 486 includes many of the same aspects as the inlet fitting 400, which are identified by like-numbered numerical references. Instead of a nipple, the inlet fitting 486 includes a collar portion 488 that surrounds the axial aperture 408 and extends axially from the first face 410 of the base portion 404, the collar portion 488 including a proximal portion 490 and a distal portion 492, the distal portion 492 defining an opening 494 that receives the porous media diffuser 402. In one embodiment, the collar portion 488 includes one or more apertures 495. In one embodiment, an O-ring 496 is disposed within a gland 497 on an interior surface 498 of the collar portion 488. Gaskets 499 can also be implemented to provide a seal between the inlet fitting 486 and the bottom portion 38 of the substrate container 30.

Functionally, the aperture(s) 416 and 495 of the various embodiments of FIGS. 16A-16C, FIGS. 17A through 17C, and FIGS. 18A-18B, as well as the shortened nipple 406e of FIG. 17D, enable air to enter the porous media diffuser 402 closer to the surface 40 of the bottom portion 38 of the wafer container 30 than with conventional purge towers that do not include lateral apertures or shortened nipples.

The nipples 406a through 406d, as well as the collar portion 488, can provide adequate bearing surfaces 484 against which the boundary 454 of the diffuser passageway 426 can register to securely fix the porous media diffuser 402 without working loose or toppling. The glue joint or weld joint 474 of nipple 406e can compensate for the reduced bearing surface of nipple 406e relative to the other nipples 406a through 406d. Of course, certain embodiments (not depicted) can include both a longer, apertured nipple in combination with a glue joint.

The O-ring 476 mounted at the base of the nipple 406b can function to register the proximal end 434 of the porous media diffuser 402. The O-ring 476 can also be compressed between the proximal end 434 of the porous media diffuser 402 and of the inlet fitting 400, thereby providing a biasing force between the interior threads 482 and the exterior threads 462 that mitigates rotation of the porous media diffuser 402 on the threaded versions of the nipples 406 (i.e., nipples 406b, 406c, and 406d) in operation. The compressed O-ring 476 can also provide a seal to prevent gas from flowing axially out the proximal end 434 and opening 432 of the porous media diffuser 402.

Figure 19:
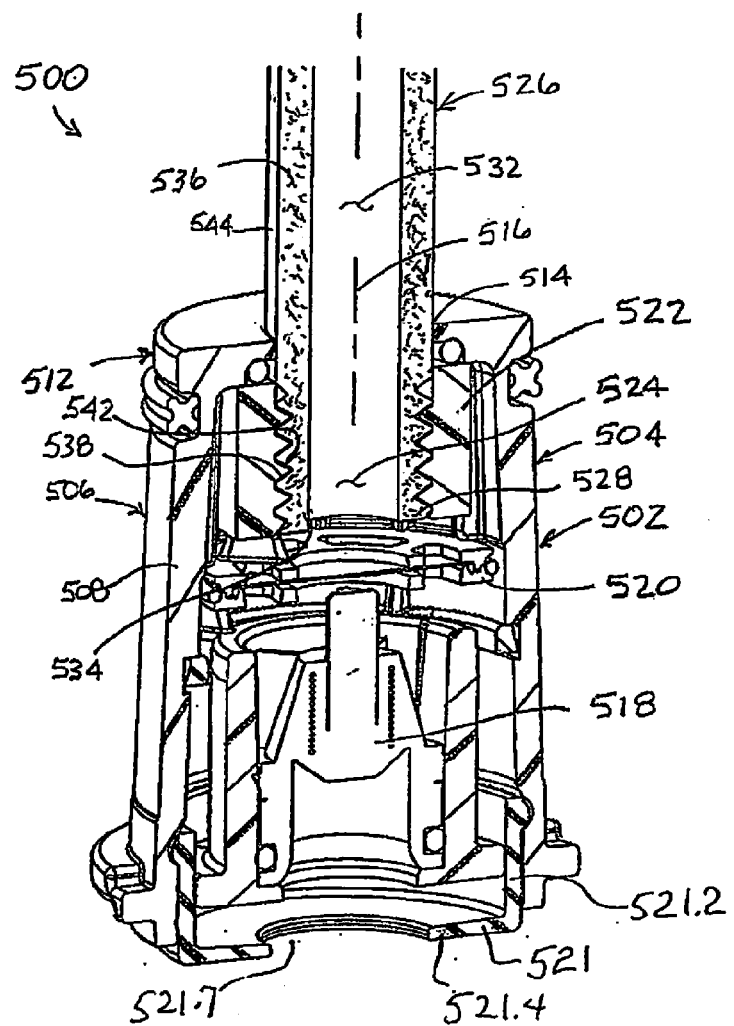
FIG. 19 is a sectional view of an inlet fitting in an embodiment of the disclosure.

Referring to FIG. 19, a porous tower diffuser assembly 500 including a purge module 502 having an inlet fitting 504 is depicted in an embodiment of the disclosure. The purge module 502 can include a housing 506 having a tubular portion 508 and a top portion 512, the top portion 512 including structure defining an aperture 514 that passes therethrough. The purge module 502 can be configured for installation in the bottom portion 38 of the substrate container 30, so that the top portion 512 is substantially flush with the interior surface 40 of the bottom portion 38. The aperture 514 defines and is concentric about a central axis 516. In one embodiment, the housing 506 is also concentric about the central axis 516 of the aperture 514. The purge module 502 can include a check valve 518 that permits flow to enter the substrate container 30 while inhibiting or preventing flow from exiting the substrate container 30. The purge module 502 can also include a filter assembly 520 that filters gases that pass therethrough. Additionally, a resilient member 521 that engages purge nozzles may be configured as elastomeric tubular portion 521.2 and a unitary diaphragm portion 521.4 with a central aperture 521.7 attached to the tubular portion 521.2. The tubular portion sealingly clamped within the assembly and the diaphragm portion extends inwardly therefrom providing a resilient seating surface for a purge nozzle. The purge nozzle engaging the apertured diaphragm portion intermediate the aperture and the tubular portion.

A coupling 522 disposed in the housing 506, the coupling 522 defining a through passage 524. In one embodiment, the through passage 524 is substantially concentric with the central axis 516 of the aperture 514 of the top portion 512. A porous media diffuser 526 having a proximal end 528 that is operatively coupled with the coupling 522 and extends through the aperture 514 of the top portion 508 of the purge module 502, the porous media diffuser 526 defining a diffuser passageway 532 that extends into the porous media diffuser 526. The diffuser passageway 532 defines an opening 534 at the proximal end 528 of the porous media diffuser 526. In one embodiment, the opening 534 is substantially concentric about the central axis 516 of the aperture 514.

The porous media diffuser 526 includes wall an openly porous sidewall portion 536 ("porous" being defined as an open porous structure that enables gaseous working fluid to exit radially through the porous media diffuser 526). In one embodiment, the porous sidewall portion 536 of the porous media diffuser 526 extends through the aperture 514 and/or immediately above the aperture 514, so that the porous sidewall portion 536 is immediately adjacent the interior surface 40 of the bottom portion 38 of the substrate container 30.

In some embodiments, the coupling 522 is a female coupling and can include internal threads 538 (as depicted). In one embodiment, the proximal end 528 of the porous media diffuser 526 can include external threads 542 on an external surface 544 thereof, the external threads 542 being compatible with the internal threads 538. In one embodimnt, the coupling 522 can depend from the top portion 512 of the housing 506; in other embodiments, the coupling 522 can be suspended from the tubular portion 508 and/or from the filter assembly 520.

Functionally, disposition of the porous sidewall portion 536 immediately adjacent the interior surface 40 of the bottom portion 38 of the substrate container 30 enables the air that exits the porous sidewall portion 536 to sweep the interior surface 40 with greater efficacy than a purge stream that is initiated higher above the interior surface 40. In some embodiments, the bottom portion 38 is of sufficient thickness for the housing 506 to define a height that permits integration of the inlet fitting 504 without displacement or redesign of the check valve 518.

The tubular portion 508 can be configured for coupling with the bottom portion 38 of the substrate container 30, and can also house a check valve that permits flow in only one direction (i.e., either into or out of the substrate container 30).

Figure 20C:
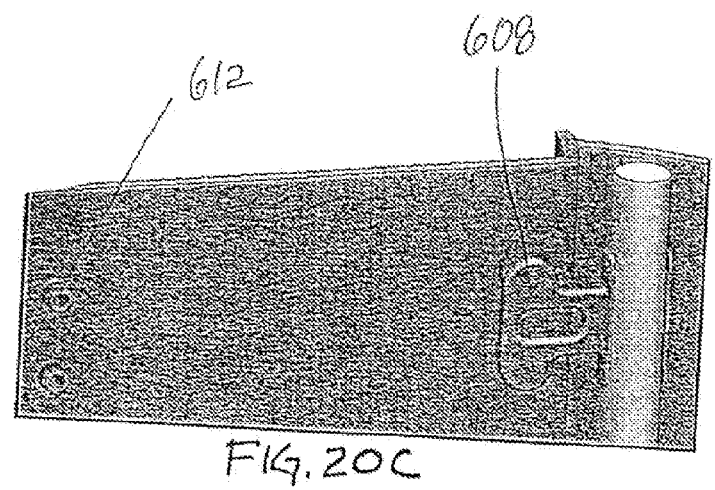
FIG. 20C is a detail view of the interior wall surface with nubs or bosses and a bracket securing a diffuser tower.
Figure 20B:
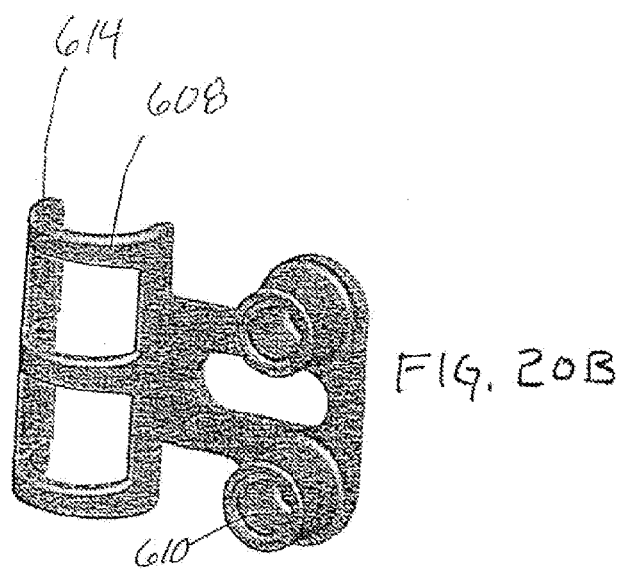
FIG. 20B is a bracket suitable for attaching a diffuser tower to a container portion.
Figure 20A:
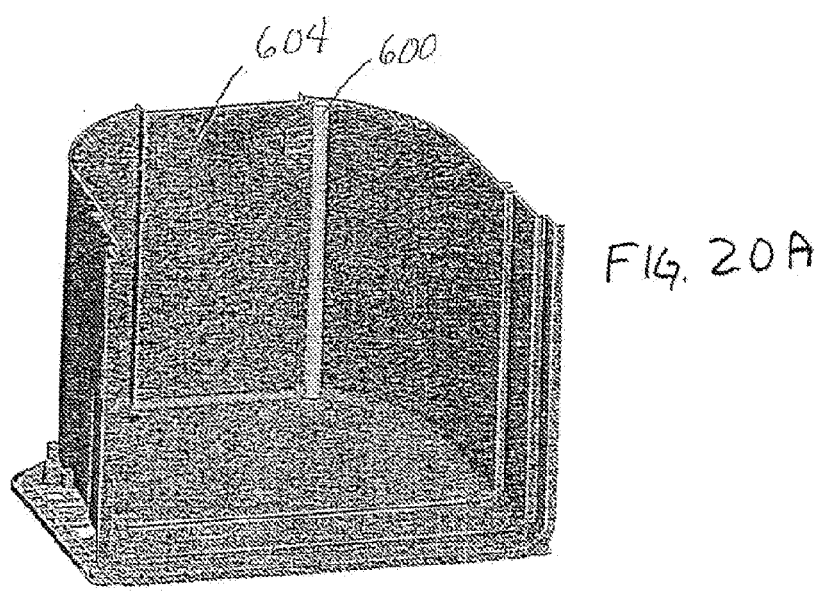
FIG. 20A is a perspective view of a container portion of a front opening wafer container with a portion removed and having a diffuser tower mounted therein by a bracket attached to nubs on the container portion interior wall surface.

FIGS. 20A, 20B, and 20C illustrate a diffuser tower 600 mounted to a container portion 604 of a front opening wafer container utilizing a bracket 608 that is secured to container portion structure such as the nubs or bosses 612. The tower bracket has a clamp portion 614 sized to resiliently secure the tubular diffuser therein.

Figure 21A:
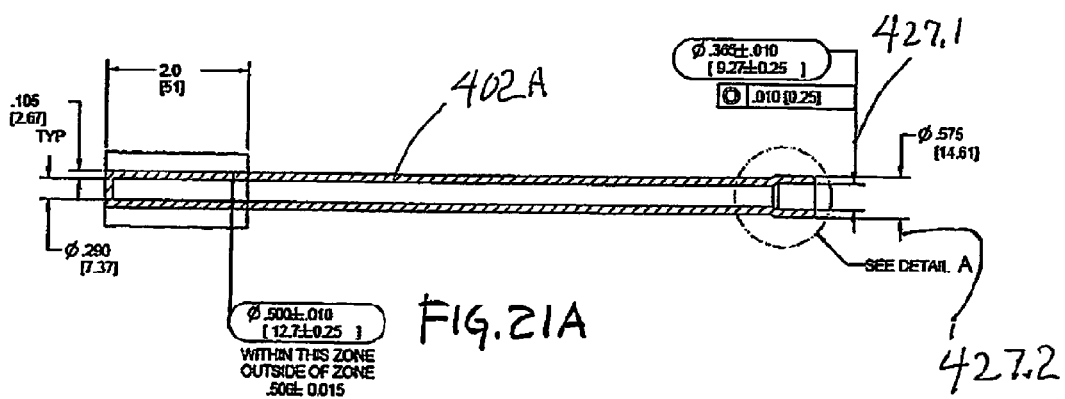
FIGS. 21A and 21B are sectional views of a porous diffuser having example dimensions in an embodiment of the disclosure.
Figure 21B:
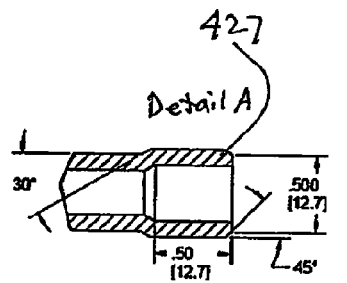

Referring to FIGS. 21A and 21B, a porous media diffuser 402A is depicted with non-limiting dimensions in an embodiment of the disclosure. The non-limiting dimensions are presented in inches, with bracketed values being in millimeters. The flared portion 427 is depicted as having an inner diameter 427.1 that is nominally 9.27 mm and an outer diameter 427.2 that is nominally 14.61 mm. In various non-limiting embodiments, the inner diameter 427.1 can be between 9 mm and 10 mm, and the outer diameter 427.2 between 14 mm and 16 mm. In various non-limiting embodiments, the inner diameter 427.1 can be between 5 mm and 15 mm, and the outer diameter 427.2 between 7 mm and 20 mm. In non-limiting embodiments, the wall thickness of the diffuser can be between 2 and 4 mm. The filter may be formed of sintered polymer or sintered ceramics.

In various non-limiting embodiments, the inner diameter 427.1 can be between 5 mm and 15 mm, and the outer diameter 427.2 between 10 mm and 20 mm.

Figure 22:
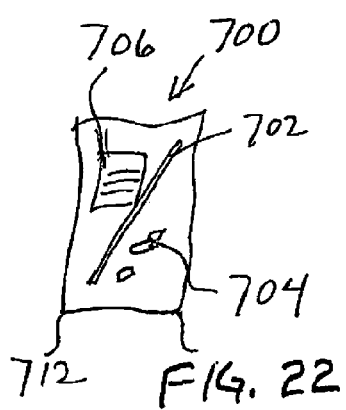
FIG. 22 illustrates a retrofit kit with a diffuser tower.

Referring to FIG. 22 a retrofit kit 700 is illustrated providing a diffuser 702, a fitting 704, and packaging 712. Written instructions 706 may also be provided directing installation.

The diffuser assemblies disclosed above are all "tower type" diffusers. Other types of diffusers can also be implemented. For example, a plenum-type diffuser compartment (not depicted) could be disposed along the back portion 42 of the substrate container 30, for example in the form of a double wall having an interior wall portion adjacent the substrates. The interior wall could be porous or include apertures or venting slots. The porosity/aperture density could vary along the height of the interior wall such that there is a lower resistance to flow near the bottom portion 38 of the substrate container 30 than near the top portion 36. Charging of the plenum-type diffuser compartment could be facilitated through ports that pass through the bottom portion 38 of the substrate container 30 that are in fluid communication with the diffuser compartment.

The following references, referred to above, are owned by the Applicant of the instant patent application, and are hereby incorporated by reference herein except for express definitions contained therein: U.S. Pat. No. 6,221,163 to Roberson et al. and U.S. Patent Application Publication No. 2012/0297981 to Burns et al.

Also, references to "embodiment(s)", "embodiment(s) of the disclosure", and "disclosed embodiment(s)" contained herein refer to the specification (text, including the claims, and figures) of this patent application that are not admitted prior art.

What is claimed is:

1. A porous tower diffuser assembly for use in a front opening wafer container, the diffuser assembly comprising:
   an inlet fitting with a base portion, a unitary offset portion, and a unitary upwardly facing nipple, the inlet fitting configured to be seated in an aperture in a bottom wall of the front opening container;
   a porous tower configured as a sintered polymer tubular portion including a lower portion, the lower portion having a larger diameter portion and engaged on the upwardly facing nipple;
   the porous tower portion having at least two different portions of different resistances to radial outflow of purge gases.

2. The porous tower diffuser assembly of claim 1 wherein the upwardly facing nipple has a plurality of barbs or a thread sized for an interference fit with the porous tower.

3. The porous tower diffuser assembly of claim 2 comprising a radial aperture in the nipple.

4. The porous tower diffuser assembly of claim 1, in combination with a front opening wafer container and a second identical porous tower diffuser assembly.

5. A front opening wafer container comprising a container portion with a front opening and a door to sealingly close the front opening, the container portion having a bottom wall, the front opening wafer container further comprising:
   an inlet fitting with a base portion, a unitary offset portion, and a unitary upwardly facing nipple, the fitting seated at an aperture in the bottom wall;
   a porous tower configured as a sintered polymer tubular portion including a lower portion having a larger diameter portion, the lower portion engaged on the upwardly facing nipple.

6. The front opening wafer container of claim 5 wherein the nipple has one of barbs or a thread, a radial aperture, and wherein an annularly extending space is defined between the nipple and the porous tower at the radial aperture.

7. The porous tower diffuser assembly of claim 5 further comprising a means for increasing purge towards the flared lower portion compared to a portion distal from the flared lower portion.

8. The front opening wafer container of claim 5 further comprising another inlet fitting with a base portion, a unitary offset portion, and a unitary upwardly facing nipple, the fitting seated at another aperture in the bottom wall;

another porous tower configured as a sintered polymer tubular portion and a flared lower portion, the flared lower portion engaged on the upwardly facing nipple.

\* \* \* \* \*